United States Patent
Park et al.

(10) Patent No.: US 9,253,880 B2
(45) Date of Patent: Feb. 2, 2016

(54) PRINTED CIRCUIT BOARD INCLUDING A PLURALITY OF CIRCUIT LAYERS AND METHOD FOR MANUFACTURING THE SAME

(71) Applicant: SAMSUNG ELECTRO-MECHANICS CO., LTD., Suwon (KR)

(72) Inventors: Mi Jin Park, Suwon-si (KR); Romero Christian, Suwon-si (KR); Seung Wook Park, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 449 days.

(21) Appl. No.: 13/689,031

(22) Filed: Nov. 29, 2012

(65) Prior Publication Data

US 2013/0133928 A1 May 30, 2013

(30) Foreign Application Priority Data

Nov. 30, 2011 (KR) .................. 10-2011-0126981

(51) Int. Cl.
| | |
|---|---|
| *H05K 1/03* | (2006.01) |
| *H05K 1/02* | (2006.01) |
| *H05K 3/40* | (2006.01) |
| *H05K 3/46* | (2006.01) |

(52) U.S. Cl.
CPC ............ *H05K 1/0298* (2013.01); *H05K 3/4038* (2013.01); *H01L 2224/10* (2013.01); *H05K 1/0237* (2013.01); *H05K 3/4644* (2013.01); *H05K 2201/09681* (2013.01); *H05K 2201/09972* (2013.01); *Y10T 29/49155* (2015.01); *Y10T 29/49165* (2015.01)

(58) Field of Classification Search
USPC .................. 174/255, 250, 253, 256–258
See application file for complete search history.

(56) References Cited

U.S. PATENT DOCUMENTS

| | | | |
|---|---|---|---|
| 2006/0223341 A1* | 10/2006 | Ramakrishnan et al. | ...... 439/55 |
| 2011/0169150 A1* | 7/2011 | Su et al. | ...... 257/675 |

FOREIGN PATENT DOCUMENTS

| | | | |
|---|---|---|---|
| KR | 10-2006-0029929 A | | 4/2006 |
| KR | 10-2011-0055972 A | | 5/2011 |

* cited by examiner

*Primary Examiner* — Tremesha S Willis
(74) *Attorney, Agent, or Firm* — NSIP Law

(57) ABSTRACT

Disclosed herein is a printed circuit board, including: a core layer; and a plurality of circuit layers stacked on the core layer, wherein one of the circuit layers includes a mesh pattern and a solid pattern, and another of the circuit layers include a first signal pattern opposite to the mesh pattern and a second signal pattern opposite to the solid pattern, the second signal pattern having a high-speed signal line with a higher speed, as compared with the second signal pattern.

10 Claims, 3 Drawing Sheets

<Transmission line Equivalent Circuit with Mesh pattern effect>

PRINTED CIRCUIT BOARD INCLUDING A PLURALITY OF CIRCUIT LAYERS AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2011-0126981, entitled "Printed Circuit Board and Method for Manufacturing the Same" filed on Nov. 30, 2011, which is hereby incorporated by reference in its entirety into this application.

BACKGROUND OF THE INVENTION

1. Technical Field

The present invention relates to a printed circuit board and a method for manufacturing the same, and more particularly, to a printed circuit board having improved bonding reliability and signal characteristics and a method for manufacturing the same.

2. Description of the Related Art

Recently, a printed circuit board has become gradually thinned and highly integrated, and further, the printed circuit board is requested to have high bonding reliability between respective circuit layers and enhanced specific signal characteristics. For example, the printed circuit board (PCB) has a structure in which insulating sheets called green sheets or build-up sheets are stacked, and circuit patterns for electric connection between the circuit layers are provided between the insulating sheets. Since the printed circuit board has a structure in which a thin plate type insulating sheets are stacked as such, bonding reliability between the insulating sheets is a factor that largely influences product characteristics of the printed circuit board. In addition, a printed circuit board is requested to selectively enhance signal characteristics of a specific signal, which is relatively important or requests high-speed characteristics.

RELATED ART DOCUMENTS

Patent Documents (Patent Document 1) Korean Patent Laid-Open Publication No. 10-2006-0029929
(Patent Document 2) Korean Patent Laid-Open Publication No. 10-2011-0055972

SUMMARY OF THE INVENTION

An object of the present invention is to provide a printed circuit board having a bonding reliability-improving structure.

Another object of the present invention is to provide a printed circuit board having improved signal characteristics.

Still another object of the present invention is to provide a method for manufacturing a printed circuit board having a bonding reliability-improving structure.

Still another object of the present invention is to provide a method for manufacturing a printed circuit board having improved signal characteristics.

According to an exemplary embodiment of the present invention, there is provided a printed circuit board, including: a core layer; and a plurality of circuit layers stacked on the core layer, wherein one of the circuit layers includes a mesh pattern and a solid pattern, and another of the circuit layers include a first signal pattern opposite to the mesh pattern and a second signal pattern opposite to the solid pattern, the second signal pattern having a high-speed signal line with a higher speed, as compared with the second signal pattern.

The circuit layers may include: a first circuit layer disposed on the core layer and having the first and second signal patterns; and a second circuit layer disposed between the core layer and the first circuit layer and having the mesh pattern and the solid pattern.

The circuit layers may include: a first circuit layer disposed on the core layer and having the first and second signal patterns; and a second circuit layer stacked on the first circuit layer and having the mesh pattern and the solid pattern.

The solid pattern may have an area equal to or larger than that of the high speed signal line.

The circuit layers may include: a first circuit layer having the mesh pattern and the solid pattern; and a plurality of second circuit layers having the first and second signal patterns, the solid pattern having a total area equal to or larger than that of a high speed signal line formed in each of the second circuit layers.

The printed circuit board may further include a conductive via provided in the second circuit layer to allow the first circuit layer and the second circuit layer to be electrically connected to each other.

According to an exemplary embodiment of the present invention, there is also provided a printed circuit board, including circuit layers stacked above and below one another, wherein one of the circuit layers has signal patterns having different signal characteristics, and another of the circuit layers has a solid pattern enhancing signal characteristics of any one of the signal patterns.

One of the signal patterns may have a high signal line with a higher speed, as compared with the other signal patterns, and the solid pattern may have a total area equal to or larger than that of the high speed line.

Another of the circuit layers may have a mesh pattern for increasing boding strength between the circuit layers.

The printed circuit board may further include a conductive via provided in at least one of the circuit layers to allow the circuit layers to be electrically connected to each other.

According to an exemplary embodiment of the present invention, there is also provided a method for manufacturing a printed circuit board, including: forming a first circuit layer having a first signal pattern and a second signal pattern, the second signal pattern having a high speed signal line with a higher speed, as compared with the first signal pattern; and forming a second circuit layer having a mesh pattern opposite to the first signal pattern and a solid pattern opposite to the second signal pattern.

The forming of the second circuit layer may include forming the solid pattern to have a total area equal to or larger than that of the high-speed signal line.

The method may further include forming a conductive via electrically connecting the first and second circuit layers to each other in at least one of the first and second circuit layers.

DESCRIPTION OF THE PREFERRED EMBODIMENTS

Figure 1:
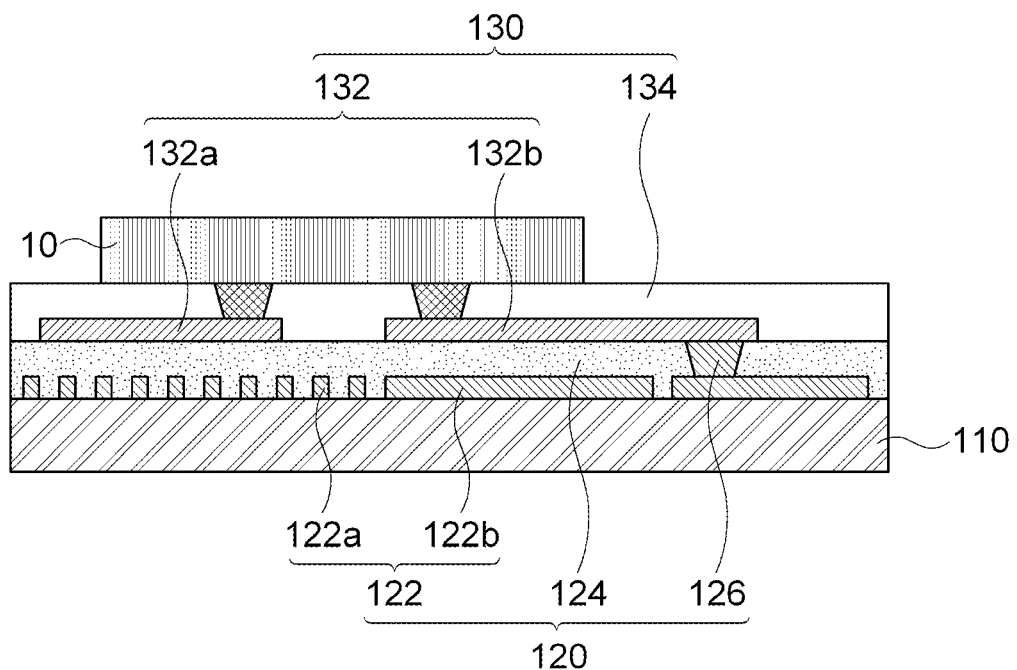
FIG. 1 is a plane view showing a printed circuit board according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals in the drawings denote like elements. Terms used in the present specification are for explaining the embodiments rather than limiting the present invention. In the specification, a singular type may also be used as a plural type unless stated specifically.

Hereinafter, a printed circuit board and a method for manufacturing a printed circuit board according to an embodiment of the present invention will be described in detail with reference to the accompanying drawings.

Figure 2:
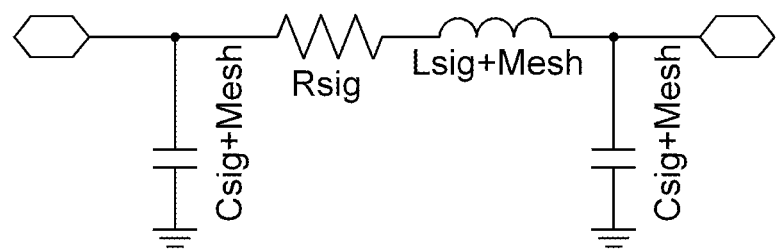
FIG. 2 is a view showing one example of a signal equivalent circuit of the printed circuit board shown in FIG. 1.

FIG. 1 is a plane view showing a printed circuit board according to an exemplary embodiment of the present invention; and FIG. 2 is a view showing one example of a signal equivalent circuit of the printed circuit board shown in FIG. 1.

Referring to FIGS. 1 and 2, a printed circuit board 100 according to an exemplary embodiment of the present invention may include a core layer 110 and a plurality of circuit layers sequentially stacked on the core layer 110. In the present exemplary embodiment, there is exemplified a case in which the circuit layers have a first circuit layer 120 and a second circuit layer 130, but the number of circuit layers may be three or more. In addition, a predetermined electric device 10 is mounted on the printed circuit board 100, which may be provided as a semiconductor package. The electric device 10 may include a semiconductor integrated circuit (IC) chip or a predetermined passive device.

The core layer 110 is a base substrate for manufacturing the printed circuit board 100, and may be positioned inside the printed circuit board 100. The core layer 110 may be formed by processing a copper clad laminate (CCL).

The first circuit layer 120 may be stacked on the core layer 110. The first circuit layer 120 may include a first circuit pattern 122 and a first insulating sheet 124. The first circuit pattern 122 may be a conductive circuit pattern. The first sheet 124 may include an insulating sheet called a green sheet. In addition, the first circuit layer 120 may further include a first conductive via 126 electrically connecting the first circuit pattern 122 and the second layer 130 in the first insulating sheet 124.

The first circuit pattern 122 may include a mesh pattern 122a and a solid pattern 122b formed in different regions on the core layer 110. The mesh pattern 122a may have a grid or porous structure, and the solid pattern 122b may have a plate or line structure. The mesh pattern 122a may have a relatively larger surface area than the solid pattern 122b. For this reason, since a bonding area between the core layer 110 and the first insulating sheet 124 is increased by the mesh pattern 122a, bonding reliability between the core layer 110 and the first circuit layer 120 can be improved.

The second circuit layer 130 may be stacked on the first circuit layer 120. The second circuit layer 130 may include a second circuit pattern 132 and a second insulating sheet 134. The second circuit pattern 132 is a conductive circuit pattern, and may include a first signal pattern 132a and a second signal pattern 132b having different signal characteristics. Here, the second signal pattern 132b may be a high speed signal line with a relatively higher speed, as compared with the first signal pattern 132a. The first signal pattern 132a may be opposite to the mesh pattern 122a and the second signal pattern 132b may be disposed to face the solid pattern 122b, such that different kinds of patterns 132a and 132b are disposed oppositely to different shapes of patterns 122a and 122b.

The solid pattern 122b can reduce parasitic components (e.g., parasitic L, C, R) generated due to the mesh pattern 122a. More specifically, parasitic components (L, C, and R) due to mutual inductance and mutual capacitance between the mesh pattern 122a and the second circuit pattern 132 may be generated. In addition to this, when the mesh pattern 122a is plural in number, the parasitic components (L, C, and R) may be generated due to mutual inductance and mutual capacitance between the plural mesh patterns 122a. These parasitic components influence the above signal lines, and in the present invention, parasitic components generated between the mesh patterns 122a can be reduced by additionally using the solid pattern 122b together with using of the mesh pattern 122a. In order to reduce the parasitic components, the solid pattern 122b may be disposed in a specific region except for the mesh pattern 122a to reduce the parasitic components.

In addition, the solid pattern 122b can enhance signal characteristics of the second signal pattern 132b. For example, since the solid pattern 122b shortens the return-path of the signal line, as compared with the mesh pattern 122a, signal characteristics such as insertion loss, return loss, and the like, can be selectively enhanced. In addition, the total area of the solid pattern 122b may be provided to be equal to or larger than the total area of the signal pattern 132b. In this case, since the solid pattern 122b secures a wider ground area to provide a stable return-path, the above signal characteristics of the second signal pattern 132b can be selectively enhanced. Whereas, if the total area of the solid pattern 122b is smaller than the total area of the second signal pattern 132b, the effect of enhancing characteristics of the second signal pattern 132b is less effective. As such, the solid pattern 122b is opposite to the specific signal pattern so as to selectively enhance signal characteristics of the specific signal pattern, thereby improving specific signal characteristics of the printed circuit board 100.

Here, when the printed circuit board 100 has three or more circuit layers, the solid pattern 122b may be provided to have a total area equal to or larger than the total area of the high-speed signal line formed in each of the circuit layers. In addition, when the second pattern 132b has a line shape and a plurality of the second patterns 132b constitute a parallel structure, the solid pattern 122b may be provided to have a total area equal to or larger than the total area of each of the second signal patterns 132b.

Meanwhile, in the above-described exemplary embodiment, a case in which the first circuit layer 100 is disposed between the core layer 110 and the second circuit layer 130 is given as an example, but the position of the first circuit layer 120 may be variously changeable. For example, for another example of the present invention, the first circuit layer 120 may be stacked on the second circuit layer 130. In this case, the mesh pattern 122a and the solid pattern 122b may be opposite to the first and second signal patterns 132a and 132b thereabove.

As described above, in the printed circuit board 100 according to the exemplary embodiment of the present invention, the first and second circuit layers 120 and 130 having predetermined circuit patterns may be stacked above the core layer 110, and here, the mesh pattern 122a may be formed in at least one of the first and second circuit layers 120 and 130. The mesh pattern 122a allows the first insulating sheet 124 and the second insulating sheet 134 to be bonded to each other through openings of the mesh pattern 122a, so that bonding strength between the core layer 110 and the first and second circuit layers 120 and 130 can be increased. For this reason, the printed circuit board according to the present invention can have a bonding reliability-improving structure while having a stacking structure in which a plurality of circuit layers are stacked, by providing the mesh pattern for increasing bonding strength between the circuit layers in at least one of the circuit layers.

In the printed circuit board 100 according to the exemplary embodiment of the present invention, the mesh pattern 122a for increasing bonding reliability between the first and second circuit layers 120 and 130 may be provided in at least one of the first and second circuit layers 120 and 130, and the solid pattern 122b may be formed in a region except for the mesh pattern 122a in order to make up for the decrease in characteristics, which results from the generation of parasitic components (i.e., parasitic L, C, R) by the mesh pattern 122b. For this reason, the printed circuit board according to the present invention can have a structure of minimizing specific loss, by providing the solid pattern for offsetting the parasitic components generated by the mesh pattern.

In addition, in the printed circuit board 100 according to the exemplary embodiment of the present invention, the solid pattern 122b of the first circuit layer 120 is disposed oppositely to the second signal pattern 132b having a high-speed signal line having a relatively higher speed thereabove or therebelow, and thus, signal characteristics of the second signal pattern 132b can be enhanced. For this reason, the printed circuit board according to the present invention can have a structure of enhancing specific signal characteristics, by disposing the solid pattern oppositely to the signal pattern so as to enhance signal characteristics of the specific signal pattern.

Hereinafter, a method for manufacturing a printed circuit board according to an exemplary embodiment of the present invention will be described. Herein, descriptions overlapping the printed circuit board 100 described with reference to FIG. 1 may be omitted or simplified.

Figure 3:
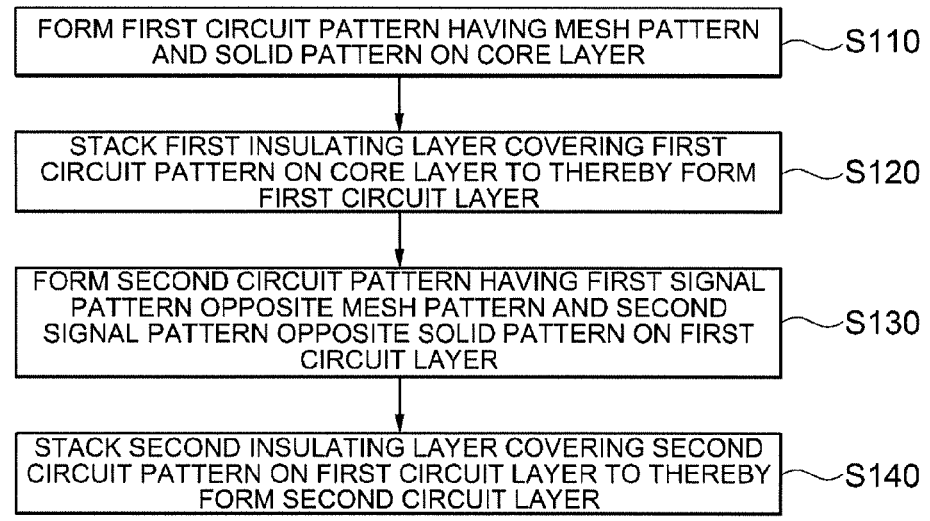
FIG. 3 is a flowchart showing a method for manufacturing a printed circuit board according to an exemplary embodiment of the present invention.
Figure 4:
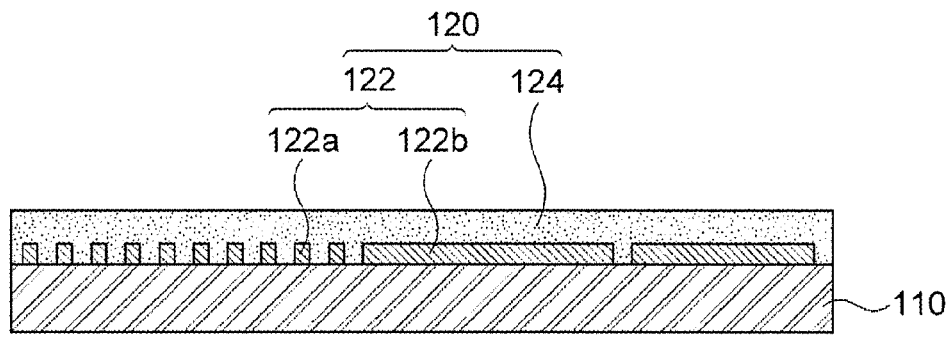
FIGS. 4 and 5 are views for explaining a process for manufacturing a printed circuit board according to the exemplary embodiment of the present invention.
Figure 5:
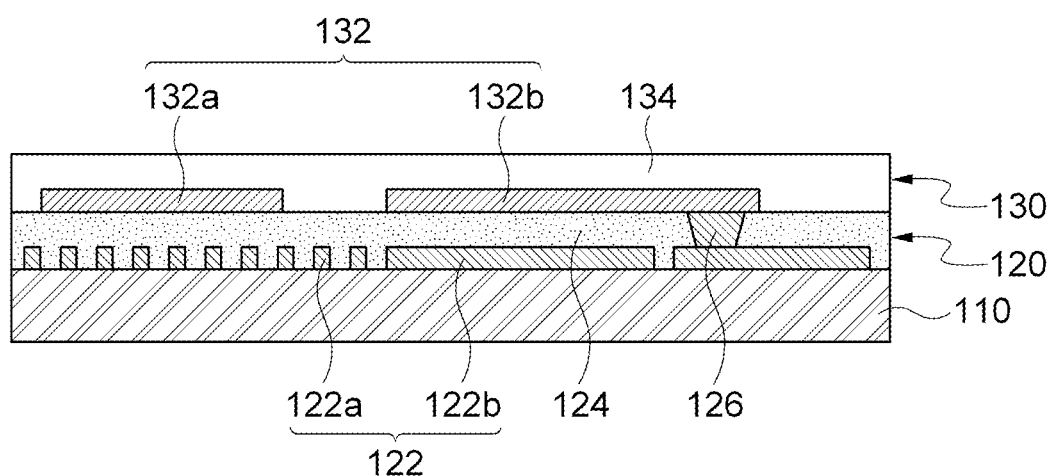

FIG. 3 is a flowchart showing a method for manufacturing a printed circuit board according to an exemplary embodiment of the present invention. FIGS. 4 and 5 are views for explaining a process for manufacturing a printed circuit board according to the exemplary embodiment of the present invention.

Referring to FIGS. 3 and 4, a first circuit pattern 122 having a mesh pattern 122a and a solid pattern 122b may be formed on a core layer 110 (S110). As one example, the preparing of the core layer 110 may include preparing a copper clad laminate (CCL). The copper clad laminate may be constituted of a core sheet and a copper foil formed on at least one surface of the core sheet.

A photolithographic process may be performed on the core layer 110, to pattern the copper foil of the core layer 110. More specifically, the patterning of the copper foil of the core layer 110 may include: forming a resist film (not shown) on the copper foil; performing an exposure process on the resist film to form a resist pattern exposing a predetermined region of the copper foil; removing the portion of the copper foil exposed through the resist pattern; and removing the resist pattern. A dry resist film (DFR) may be used as the resist film. For another example, the first circuit pattern 122 may be formed by using a predetermined etching process, a laser processing process, or the like. Through this process, the first pattern 122 having the mesh pattern 122a of a lattice structure and the solid pattern 122b of a plate structure may be formed on the core sheet.

Then, a first insulating sheet 124 may be stacked on the core layer 110, thereby forming the first circuit layer 120 (S120). As one example, the stacking of the first insulating sheet 124 may include laminating a predetermined insulating film on the core layer 110. As another example, the stacking of the first insulating sheet 124 may include compressing a buildup sheet onto the core layer 110, and here, the build-up sheet has a copper foil formed on surface thereof. Here, since the mesh pattern 122a has a relatively higher surface area than general flat structured patterns, the first insulating sheet 124 can be bonded to the mesh pattern 122a through high bonding strength. For this reason, the core layer 110 and the first circuit layer 120 can have high bonding reliability.

Meanwhile, when the mesh pattern 122a is provided in order to improve bonding reliability between the core layer 110 and the first circuit layer 120, signal characteristics may be reduced due to the parasitic components of the mesh pattern 122a. In order to reduce the parasitic components (i.e., parasitic L, C, R), the loss in signal characteristics due to the parasitic components can be minimized, by appropriately disposing the solid pattern 122b in a surrounding region of the mesh pattern 122a.

Referring to FIGS. 3 and 5, a second circuit pattern 132 having a first signal pattern 132a opposite to the mesh pattern 122a and a second signal pattern 132b opposite to the solid pattern 132b may be formed on the first circuit layer 120 (S130). The forming of the second circuit pattern 132 may include forming a plating film on the first insulating sheet 124 of the first circuit layer 120 and patterning the plating film.

Then, a second insulating sheet 134 may be stacked on the first circuit layer 120, thereby forming a second circuit layer 130 (S140). For this reason, a printed circuit board having a structure in which a plurality of circuit layers are stacked may be manufactured. Meanwhile, an electric device 10 may be further mounted on the thus manufactured printed circuit board, thereby manufacturing the semiconductor package 100 shown in FIG. 1.

Meanwhile, before the forming of the second circuit pattern 132, a conductive via 126 for electrically connecting the first circuit pattern 122 to the second circuit pattern 132 may be formed on the first circuit layer 110. The forming of the conductive via 136 may include forming a via hole for exposing the first circuit pattern 122 in the first insulating sheet 124 and forming a metal film filling the via hole. The forming of the metal film may be performed by a predetermined plating process.

As described above, in the method for manufacturing a printed circuit board according to the exemplary embodiment of the present invention, the first and second circuit layers 120 and 130 having predetermined circuit patterns may be stacked above the core layer 110, and here, the mesh pattern 122a for improving bonding reliability between the first and second circuit layers 120 and 130 may be formed in at least one of the first and second circuit layers 120 and 130. The mesh pattern 122a allows the first insulating sheet 124 and the second insulating sheet 134 to be bonded to each other through openings of the mesh pattern 122a, so that bonding strength between the first and second circuit layers 120 and 130 can be increased. For this reason, according to the method for manufacturing a printed circuit of the present invention, a printed circuit board having improved bonding reliability and reduced bonding stress between the circuit layers can be manufactured, by providing a stacking structure in which a plurality of circuit layers are stacked while a mesh pattern for increasing bonding strength between circuit layers is provided in at least one of the circuit layers.

In the method for manufacturing a printed circuit board according to the exemplary embodiment of the present invention, the mesh pattern 122a for increasing bonding reliability between the first and second circuit layers 120 and 130 may be provided in at least one of the first and second circuit layers 120 and 130, and the solid pattern 122b may be formed in a region except for the mesh pattern 122a in order to make up for the decrease in characteristics, which results from the parasitic components (e.g., parasitic L, C, R) by the mesh pattern 122a. For this reason, according to the method for manufacturing a printed circuit board of the present invention, a printed circuit board capable of minimizing the loss in signal characteristics can be manufactured, by providing a solid pattern that reduces the parasitic components generated by the mesh pattern for improving the bonding reliability.

As set forth above, the printed circuit board according to the present invention can have a bonding reliability-improving structure while having a stacking structure in which a plurality of circuit layers are stacked, by providing the mesh pattern for increasing bonding strength between the circuit layers in at least one of the circuit layers.

Further, the printed circuit board according to the present invention can have a structure of minimizing specific loss, by providing the solid pattern of offsetting the parasitic components generated by the mesh pattern.

Further, the printed circuit board according to the present invention can have a structure of enhancing specific signal characteristics, by disposing the solid pattern oppositely to the signal pattern so as to enhance signal characteristics of the specific signal pattern.

Further, according to the method for manufacturing a printed circuit of the present invention, a printed circuit board having improved bonding reliability and reduced bonding stress between the circuit layers can be manufactured, by providing a stacking structure in which a plurality of circuit layers are stacked while a mesh pattern for increasing bonding strength between the circuit layers is provided in at least one of the circuit layers.

Further, according to the method for manufacturing a printed circuit board according to the present invention, a printed circuit board capable of minimizing the loss in signal characteristics can be manufactured by providing a solid pattern that reduces the parasitic components generated by the mesh pattern for improving the bonding reliability.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A printed circuit board, comprising:
    a core layer; and
    a plurality of circuit layers stacked on the core layer,
    wherein one of the circuit layers includes a mesh pattern and a solid pattern, and another of the circuit layers includes a first signal pattern opposite to the mesh pattern and a second signal pattern opposite to the solid pattern,
    wherein the first and second signal patterns have signal lines which are not contact pads, and the second signal pattern has a high speed signal line with a higher speed, as compared with the first signal pattern, and
    wherein the solid pattern is a ground pattern and has an area equal to or larger than that of the high speed signal line.

2. The printed circuit board according to claim 1, wherein the circuit layers include:
    a first circuit layer disposed on the core layer and having the first and second signal patterns; and
    a second circuit layer disposed between the core layer and the first circuit layer and having the mesh pattern and the solid pattern.

3. The printed circuit board according to claim 1, wherein the circuit layers include:
    a first circuit layer disposed on the core layer and having the first and second signal patterns; and
    a second circuit layer stacked on the first circuit layer and having the mesh pattern and the solid pattern.

4. The printed circuit board according to claim 1, wherein the circuit layers include:
    a first circuit layer having the mesh pattern and the solid pattern; and
    a plurality of second circuit layers having the first and second signal patterns, the solid pattern having a total area equal to or larger than that of a high speed signal line formed in each of the second circuit layers.

5. The printed circuit board according to claim 1, further comprising a conductive via provided in the second circuit layer to allow the first circuit layer and the second circuit layer to be electrically connected to each other.

6. A printed circuit board, comprising circuit layers stacked above and below one another,
    wherein one of the circuit layers has signal patterns having different signal characteristics, and another of the circuit layers has a solid pattern enhancing signal characteristics of any one of the signal patterns,
    wherein the signal patterns have signal lines which are not contact pads, and one of the signal patterns has a high speed signal line with a higher speed, as compared with the other signal patterns, and
    wherein the solid pattern is a ground pattern and has a total area equal to or larger than that of the high speed signal line.

7. The printed circuit board according to claim 6, wherein another of the circuit layers has a mesh pattern for increasing bonding strength between the circuit layers.

8. The printed circuit board according to claim 6, further comprising a conductive via provided in at least one of the circuit layers to allow the circuit layers to be electrically connected to each other.

9. A method for manufacturing a printed circuit board, comprising:
- forming a first circuit layer having a first signal pattern and a second signal pattern, the first and second signal patterns have signal lines which are not contact pads, and the second signal pattern having a high speed signal line with a higher speed, as compared with the first signal pattern; and
- forming a second circuit layer having a mesh pattern opposite to the first signal pattern and a solid pattern opposite to the second signal pattern;
- wherein the forming of the second circuit layer includes forming the solid pattern which is a ground pattern to have a total area equal to or larger than that of the high speed signal line.

10. The method according to claim 9, further comprising forming a conductive via electrically connecting the first and second circuit layers to each other in at least one of the first and second circuit layers.

* * * * *